United States Patent [19]

Bernhardt et al.

[11] Patent Number: 5,759,016
[45] Date of Patent: Jun. 2, 1998

[54] DEVICE FOR CONTINUOUSLY COOLING APPARATUSES

[75] Inventors: Hermann Bernhardt; Frank Notter. both of Nufringen, Germany

[73] Assignee: International Business Machines Corporation, Armonk, N.Y.

[21] Appl. No.: 696,872

[22] PCT Filed: Apr. 6, 1995

[86] PCT No.: PCT/EP95/01266

§ 371 Date: Aug. 15, 1996

§ 102(e) Date: Aug. 15, 1996

[87] PCT Pub. No.: WO95/28821

PCT Pub. Date: Oct. 26, 1995

[30] Foreign Application Priority Data

Apr. 15, 1994 [DE] Germany ............ 44 13 173.9

[51] Int. Cl.⁶ .................. F04B 9/14; F04B 35/04
[52] U.S. Cl. ............ 417/374; 417/359; 417/423.5; 165/80.3; 62/259.2; 415/61
[58] Field of Search ............ 417/319, 359, 417/362, 374, 335, 423.5, 423.6, 423.12; 415/60, 61; 361/695, 678; 165/80.3; 62/259.2

[56] References Cited

U.S. PATENT DOCUMENTS

| | | | |
|---|---|---|---|
| 2,936,107 | 5/1960 | Blackburn | 417/374 |
| 4,398,872 | 8/1983 | Fleenor et al. | 417/374 |
| 4,697,991 | 10/1987 | Tsukahara et al. | 417/319 |
| 4,756,473 | 7/1988 | Takemae et al. | |
| 5,035,585 | 7/1991 | Berges et al. | 417/362 |

FOREIGN PATENT DOCUMENTS 2503623  8/1976  Germany.

OTHER PUBLICATIONS

Miller et al., 'Dual Motor Air Moving Device', IBM Technical Disclosure Bulletin, vol. 37, No. 05, May 1994, p. 373.
Batchelor et al., 'Management of a Redundant Cooling System', IBM Technical Disclosure Bulletin, vol. 37, No. 06A, Jun. 1994, p. 257.

*Primary Examiner*—Charles G. Freay
*Attorney, Agent, or Firm*—Lawrence D. Cutter

[57] ABSTRACT

The proposal is for a device for continuously cooling apparatuses with at least one circulation mechanism to circulate a coolant, wherein the circulation mechanism has at least one drive mechanism and at least one distribution means driven by the at least one drive mechanism to distribute the coolant, characterized by at least one auxiliary mechanism couplable to the at least one distribution mechanism; wherein, in the event of failure of a drive mechanism, the at least one auxiliary mechanism is coupled to the distribution means and maintains the functioning of the distribution mechanism concerned. Thus in the event of the failure of a circulation mechanism, the flow conditions of the coolant in the apparatuses are substantially maintained.

12 Claims, 4 Drawing Sheets

DEVICE FOR CONTINUOUSLY COOLING APPARATUSES

DESCRIPTION

The invention discloses a device for continuously cooling apparatuses with at least one circulation means to circulate a coolant, wherein the circulation means has at least one drive means and at least one distribution means driven by at least one drive means to distribute the coolant.

Cooling devices are used in many applications and their importance has grown in recent years with the increasing heat sensitivity of the components to be cooled. Today fan systems with several fans are the state of the art. In the event of failure of a fan an attempt is made to guide the air flow by means of flaps so that adequate cooling can be achieved. However, since in the event of failure of a fan the precalculated and optimized spatial air flow changes, the flow conditions inevitably change as well, and so the cooling of components also changes. This can lead to overheating and resultant defects, and to premature aging of the components or even to a shutdown of the complete system.

DE-A-2 503 623 discloses an aeration device for an electrical switch cabinet, in which at least two ventilator fans are provided for the switch cabinet. The ventilator fans are arranged axially immediately behind each other, with an electromagnetic locking device provided on at least one of the fans, by means of which the fan concerned is blocked while the other fan is in operation, and is automatically released in the event of failure of the other fan.

The object of the invention is to create a device for continuously cooling devices by substantially maintaining the flow conditions of the coolant in the apparatus in the event of failure of a circulation means.

The object of the invention is furthermore to minimize and to evenly distribute the motive power of the remaining circulation means in the event of failure of one or more circulation means.

The object is achieved in accordance with the invention by using at least one auxiliary means coupled to the at least one distribution means, wherein, in the event of failure of a drive means, the at least one auxiliary means is coupled to the distribution means in question and maintains the functioning of the distribution means.

The science of the invention relates primarily to the ventilation of gaseous coolants, but is not restricted to them. It can also be applied for circulation devices with liquids.

Further advantageous embodiments of the invention are set out in the dependent claims.

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 1b shows a sectional view of the flow characteristic in the arrangement from FIG. 1a;

DETAILED DESCRIPTION OF THE PREFERRED EMBODIMENTS

Figure 1A:
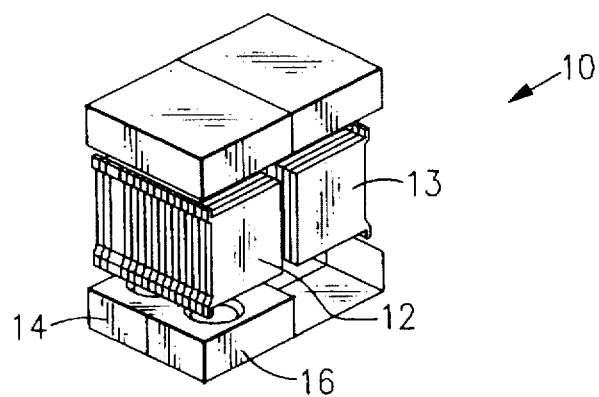
FIG. 1a shows the construction of a cooling device according to the state of the art for cooling a multiplicity of electronic plug-in boards, such as occur in data processing systems.

FIG. 1a shows the construction of a cooling device 10 for cooling a multiplicity of electronic plug-in boards 12 and 13, as occur in data processing systems. The cooling device 10 contains a first fan 14 and a second fan 16 for ventilation of the air in the cooling device 10.

Figure 1B:
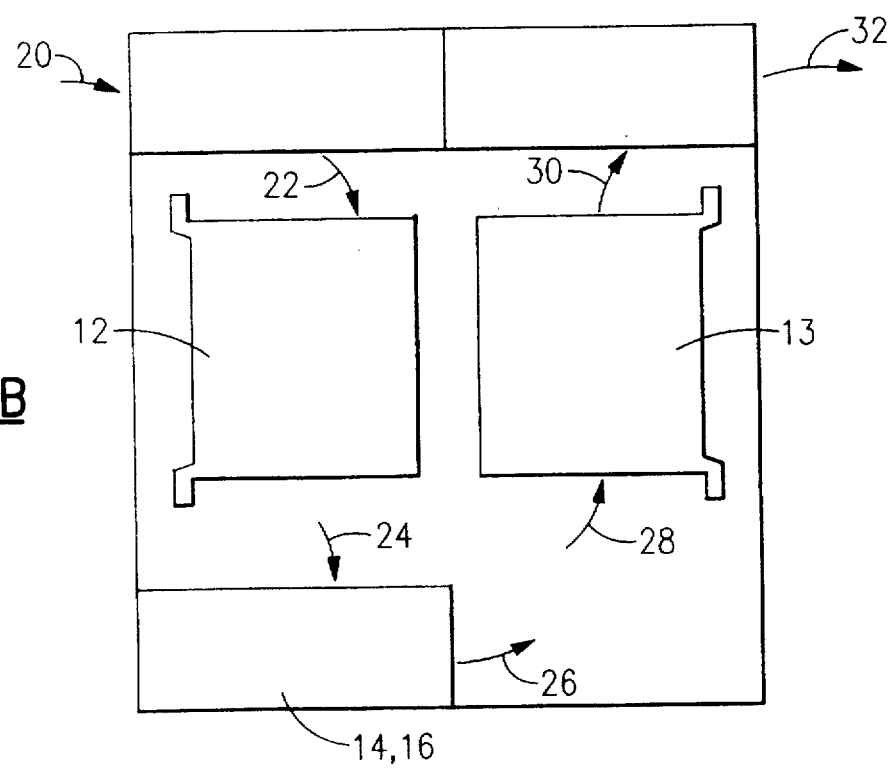

FIG. 1b then shows a sectional view of the flow characteristic in the arrangement from FIG. 1a. The air enters on the side of the cooling device 10 at the point marked by the arrow 20, then follows the path 22 to 30—in the direction of the arrow—and exits from the cooling device at the point 32, opposite the arrow 20. In this process, the air first flows over the surfaces of the plug-in boards on the left 12, is driven on by the fans 14 or 16, and then flows over the plug-in boards on the right 13.

Figure 2:
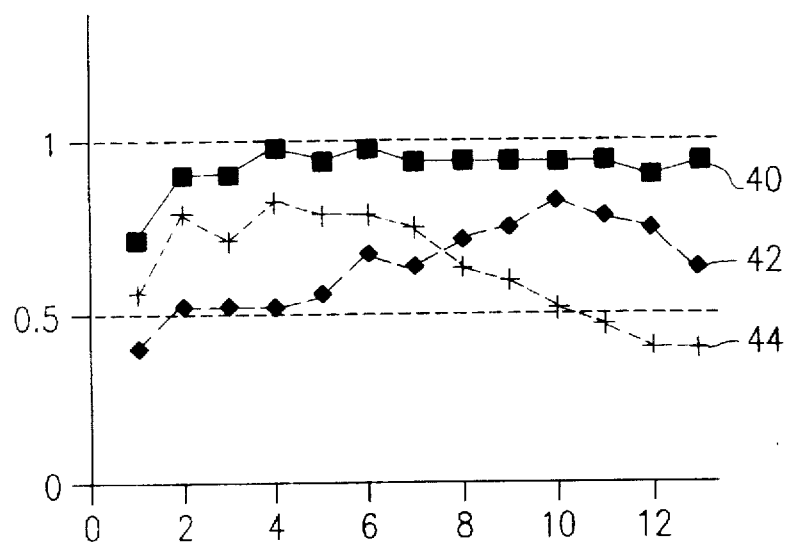
FIG. 2 shows the measured distribution of flow velocities in a system based on FIG. 1a according to the state of the art.

In the event of failure of one of the fans 14 or 16, in cooling devices according to the state of the art (not shown) distributor flaps are aligned such that aeration of all boards can be guaranteed. FIG. 2 shows the measured distribution of the flow velocities in such a system. The board positions are entered qualitatively on the abscissa and the air flow velocities, measured at each center point of the boards, along the ordinate. In this, board position 1 designates the plug-in boards 12 or 13 shown at the furthest left in FIG. 1a.

The characteristic 40 represents the flow distribution in normal operation, with both fans 14 and 16 operating at normal rotation speed (1300 rpm). Characteristic 42 then shows the flow distribution on the plug-in boards in the event of failure of the left-hand fan 14 and characteristic 44 shows the distribution in the event of failure of the right-hand fan 16. The remaining fan in each case, 16 or 14, is operated at maximum rotation speed (1950 rpm). As can be seen from characteristics 42 and 44, the flow velocity on the plug-in boards over the still functioning fan falls by around a quarter, and over the failed fan by around a half, despite the maximum rotation speed. Thus, adequate cooling is not guaranteed for all boards and the components on them, and the system must be shut down after a time in order to protect sensitive components.

Figure 3:
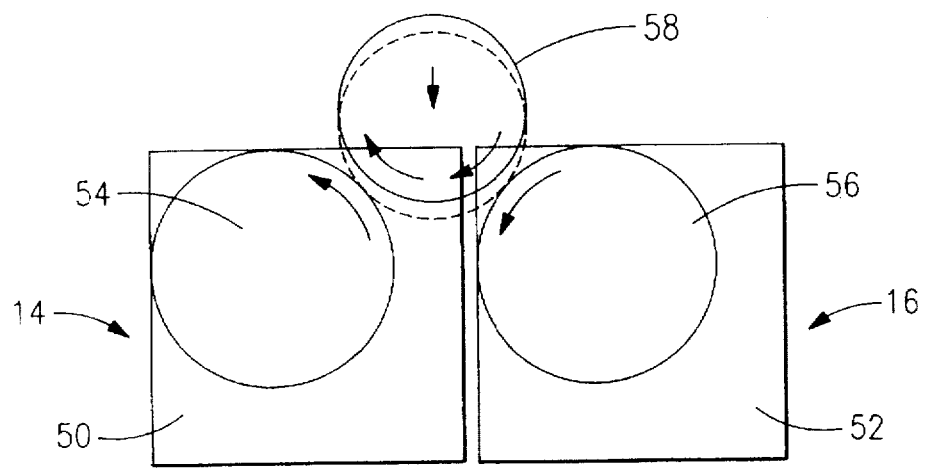
FIG. 3 shows an embodiment of the invention which allows reliable cooling of the cooling device from FIG. 1a also in the event of failure of one of the fans.

FIG. 3 shows an embodiment of the invention which allows reliable cooling in the event of failure of one of the fans 14 or 16. Fans 14 and 16 respectively consist of a drive unit 50 or 52, containing the motor and bearing, and a fan wheel 54 or 56 for air ventilation. A coupling element 58 is then executed as couplable to the fan wheels 54 and 56. In the event of failure of one of the two fans 14 or 16 the coupling element 58 is coupled onto both fan wheels 54 and 56 (shown by the dotted circle) and thus maintains the functioning of the failed fan with the same direction of rotation.

The function of the coupling element 58 can in principle be either passive or active. In the passive case, the coupling element may be a gear wheel, friction wheel, cog wheel, belt, bevel wheel or the like, which in the event of failure of a first fan couples the said fan to at least a second fan or more fans and drives the defective fan by means of power transmission. In the active case, the coupling element additionally has its own drive unit and so—in contrast to the passive function—need only be coupled to the defective fan and then drives it actively itself. Due to the mainly point-concentrated coupling of the coupling element to the fan wheels, when the fans 14 and 16 are set up in parallel their direction of rotation is retained even in the event of failure. The direction of rotation of the individual wheels is shown in FIG. 3 by appropriate arrows.

Figure 4:
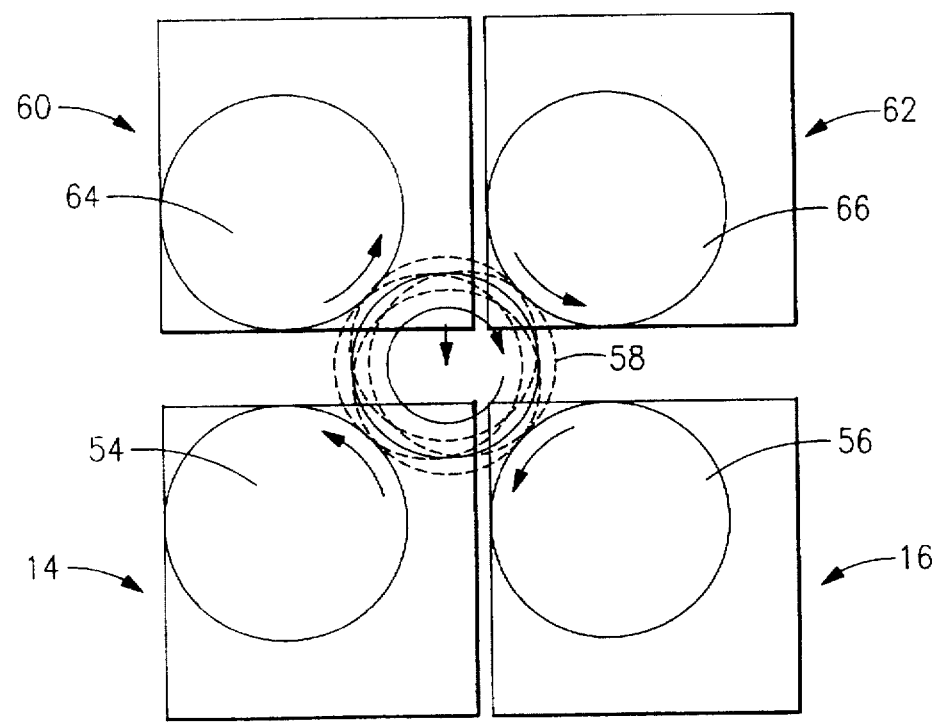
FIG. 4 shows an expanded cooling device with four fans, each rotating in the same direction.

FIG. 4 shows an expanded cooling device with four fans 14, 16, 60 and 62, each with the same direction of rotation. Fan 60 has a fan wheel 64 and fan 62 a fan wheel 66. A multiplicity of possibilities now opens up for the coupling element 58 to maintain the functioning of one or more failed fans. In the simplest case, in the event of failure of fan 14 for example, the coupling element 58 is coupled either to the fan pair 14 and 16 or to the fan pair 14 and 60. This produces a degree of freedom in selection of the fan pair which may play a decisive role, especially in the event of lengthy downtimes, in that the fan pair can be varied and overloading of a maintaining fan can be avoided. However, if the coupling element 58 is executed in the form of a bevel wheel with variable outer diameter, an additional degree of freedom is produced in that then all fans can be coupled simultaneously. The motive power is thus distributed evenly across all driving fans and the load on an individual fan is reduced. Moreover, the functioning of several failed fans in the same arrangement can be maintained. The possible positions of the coupling element 58 for the degree of freedom described are represented by dotted lines in FIG. 4.

It also frequently occurs that in the drive units of the fans the bearings are damaged, leading to failure of the fan. Maintaining the functioning of the fan as described above would, however, impair the functioning of the driving fans coupled by means of the coupling element 58, as a result of the bearing damage, and may even cause the driving fans also to fail due to the increased bearing friction. In order to maintain fan functioning even in the event of bearing damage, in an embodiment of the invention as shown in FIG. 5 the fan has an additional, redundant bearing.

Figure 5:
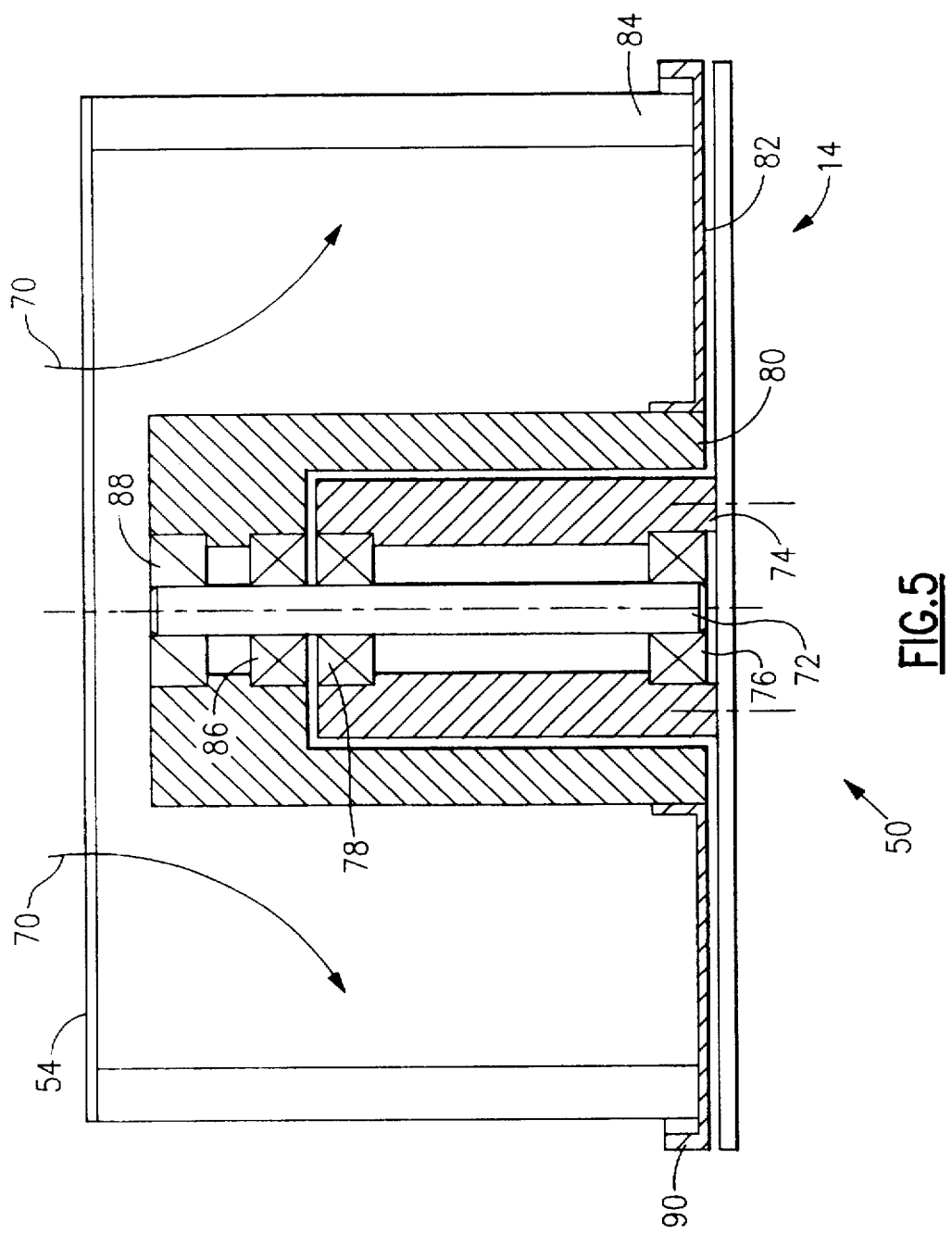
FIG. 5 shows a sectional view of the construction of a fan with redundant bearing.

FIG. 5 shows a sectional view of the construction of the fan 14 with redundant bearing. Fan wheel 54 is arranged externally in this execution, and is driven by the internal drive unit 50. Drive unit 50 consists of the motor shaft 72, the motor stator 74, and of the drive bearing 76 on one end of the motor stator 74, and the drive bearing 78 on the other end of the motor stator 74.

The fan wheel 54 consists of a motor rotor 80, a blower wheel 82 with fan blades 84 arranged on it in rotationally symmetrical configuration to the direction of the air flow 70, and a first redundant bearing 86 and a second redundant bearing 88 with coupling. A coupling wheel 90 is also attached to the fan blades 84 to couple the coupling element 58 to the fan 14.

In normal operation the motor shaft 72 rotates in the bearing system formed by the drive bearings 76 and 78. The redundant bearing 88 is fitted with a (free-running) coupling, which closes when motive force is provided by the internal motor 50. The redundant bearings 86/88 rotate in normal operation without the use of their bearing function—and thus without wear.

In the event of failure of a drive bearing 76 and/or 78, and where the blower wheel 82 is driven by the coupling element 58 and the coupling wheel 90, the coupling of bearing 88 opens. The motor rotor 80 is thus borne in the redundant bearing system 86/88. The possibly defective bearings 76 and/or 78 can be stopped without impairing rotation of the blower wheel 82.

Figure 6:
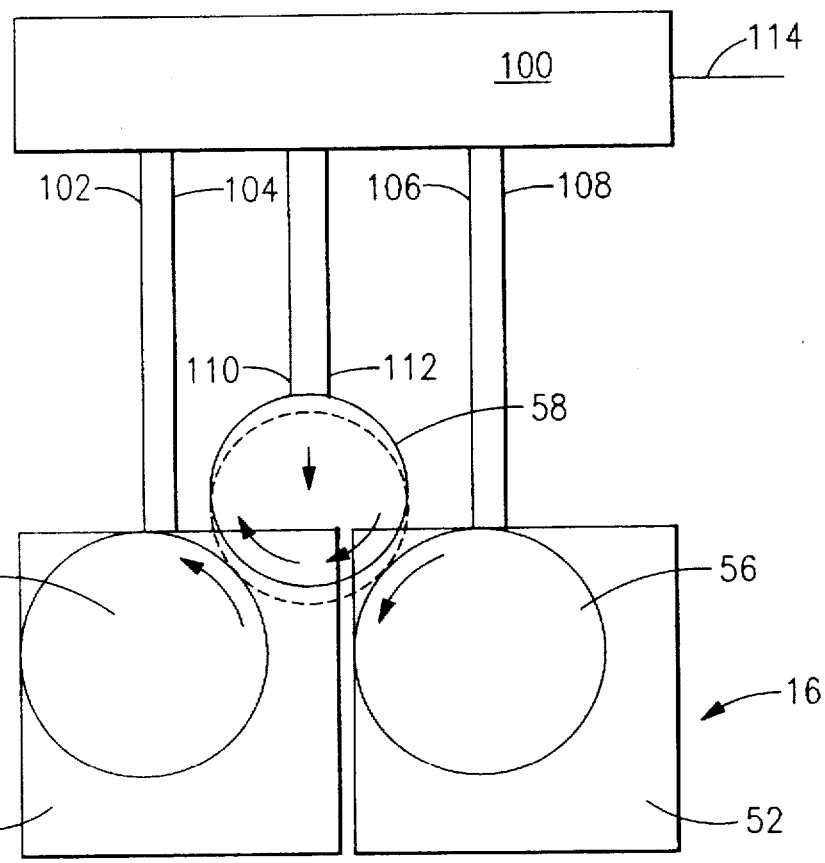
FIG. 6 shows the construction of the cooling device based on FIG. 3 with a control unit.

FIG. 6 shows the construction of the cooling device based on FIG. 3 with a control unit 100. The control unit 100 is coupled onto the fan 14 by way of a cable 102 on its fan wheel 54 and a cable 104 on its drive unit 50. In the passive function, the control unit 100 is coupled further onto the fan 16 by way of a cable 106 on its fan wheel 56 and a cable 108 on its drive unit 52. The coupling element 58 is actuated by the control unit 100 by way of a cable 110, and by way of an optional cable 112 returns information on its operating conditions to the control unit 100. The output of the control unit 100 is a cable 114 by which the control unit 100 delivers a fault signal in the event of failure of a fan, thus facilitating rapid fault detection.

The fans 14 and 16 signal to the control unit 100 by way of the appropriate cables any faults and irregularities in the operating conditions of the fans, such as drive unit failure or bearing damage. The control unit 100 evaluates these signals and controls the functioning of the coupling element 58 accordingly to maintain the fan function of the overall cooling device 10. In the active function, the control unit 100 then controls the coupling of coupling element 58 either selectively to the defective fan concerned or, additionally, to still functioning fans in order to allow more even distribution of the motive power.

In the passive function, the control unit 100 controls the functioning of the coupling element 58 by facilitating power transmission through a suitable connection of the coupling element 58 from at least one still functioning fan to the defective fan. For this, the coupling element 58 is moved adjacent to the defective fan and to another, functioning, fan. As already described above, power transmission then occurs either by means of static friction or any form of gear wheel. By way of cable 112 the control unit 100 can monitor the build-up of successful power transmission, and thus the restoration of the overall fan function of the cooling device 10, based on the rotation rates of the coupling element 58 and the fans, for example.

In a setup in accordance with FIG. 4 with four or more fans, the function shown in FIG. 6 is applied in like manner, with the difference that the control unit 100 can then utilize the degrees of freedom in coupling as described above. The control unit 100 can, in particular, vary the driving fan by selection or, with appropriate construction, couple it to all fans simultaneously by variation of the outer diameters and thus distribute the motive power across all fans. In a further embodiment of the invention the coupling element 58 has a bevel form and so is able to adjust the outer diameter by means of height adjustment.

The principle as described above of maintaining the function of a fan can be applied in like manner to any form of fan. Nor is the science of this invention limited to the ventilation of gaseous coolants; it can also be applied for circulation devices with liquids.

We claim:

1. A device for continuously cooling an electrical apparatus, said device comprising:
   at least two circulation means to circulate a coolant, wherein each circulation means has
      at least one drive means and
      at least one distribution means driven by said at least one drive means to distribute the coolant;
   at least one auxiliary means coupleable between distribution means in distinct circulation means;
   wherein, in the event of failure of one of said drive means, said at least one auxiliary means is coupleable between said distribution means in distinct circulation means and is able to maintain the functioning of said distribution means formerly driven by said failed drive means.

2. The device in accordance with claim 1 in which, in the event of failure of one of said drive means, said at least one auxiliary means is coupleable to one of said distribution means, which is driven by one of said drive means such that an other one of said distribution means is driven by at least one other drive means of another circulation means.

3. The device in accordance with claim 1, wherein said at least one auxiliary means has a drive means.

4. The device in accordance with claim 1, in which said at least one auxiliary means has a coupling element to transmit rotational movement.

5. The device in accordance with claim 4, wherein said coupling element has an outer diameter which is adjustable.

6. The device in accordance with claim 4 wherein said coupling element is selected from the group consisting of a gear wheel, a friction wheel, a cog wheel, a belt and a bevel wheel.

7. The device in accordance with claim 1 wherein said at least one circulation means has at least two bearings one of which is redundant.

8. The device in accordance with claim 1 further including a signaling means which signals the occurrence of a fault.

9. The device in accordance with claim 1 in which said at least one distribution means is selected from the group consisting of a blower wheel, a fan wheel and an impeller wheel.

10. The device in accordance with claim 1 wherein said at least one circulation means is a ventilator fan for ventilation of gaseous coolants.

11. The device in accordance with claim 1 wherein said coolant is gaseous.

12. The device in accordance with claim 1 wherein said coolant is liquid.

* * * * *

UNITED STATES PATENT AND TRADEMARK OFFICE
CERTIFICATE OF CORRECTION

PATENT NO. : 5,759,016
DATED : January 02, 2000
INVENTOR(S) : Bernhardt et al.

It is certified that error appears in the above-identified patent and that said Letters Patent is hereby corrected as shown below:

In the Abstract, line 5 and line 10, "means" should be --mechanism--.

Signed and Sealed this

Twelfth Day of September, 2000

Attest:

Q. TODD DICKINSON

*Attesting Officer*       *Director of Patents and Trademarks*